United States Patent [19]

Emeott

[11] Patent Number: 5,493,584
[45] Date of Patent: Feb. 20, 1996

[54] METHOD FOR DETERMINING A CHANNEL QUALITY METRIC IN A RECEIVER

[76] Inventor: Stephen P. Emeott, 723 Belinder La., Apt. 2221, Schaumburg, Ill. 60173

[21] Appl. No.: 172,792

[22] Filed: Dec. 27, 1993

[51] Int. Cl.⁶ .............................. H04B 3/46; H03D 1/00; G06F 11/10
[52] U.S. Cl. ............................. 375/224; 375/340; 371/43
[58] Field of Search ........................ 375/10, 94, 39–42, 375/17, 27, 224, 340, 261, 269, 286, 244; 371/43

[56] References Cited

U.S. PATENT DOCUMENTS

| 5,056,117 | 10/1991 | Gitlin | 375/39 |
| 5,159,608 | 10/1992 | Falconer | 371/43 |
| 5,195,107 | 4/1993 | Wei | 371/43 |
| 5,384,809 | 1/1995 | Yagi | 375/39 |

Primary Examiner—Scott A. Rogers
Assistant Examiner—Allan A. Esposo
Attorney, Agent, or Firm—Christopher P. Moreno; James A. Coffing

[57] ABSTRACT

In a receiver, a channel quality metric (220) is determined by demodulating a received second stream of discrete data elements (205) using a received first stream of discrete data elements (203) to produce a demodulated second stream of discrete data elements (212). The demodulated second stream is decoded, leading to an estimate of the second stream of discrete data elements (214). The estimate of the second stream is then re-encoded and the resulting re-encoded stream of discrete data elements (216) is compared with the demodulated second stream to produce the channel quality metric. Derived in this manner, the channel quality metric provides a method for detecting decoding errors in a stream of critical data elements.

13 Claims, 3 Drawing Sheets

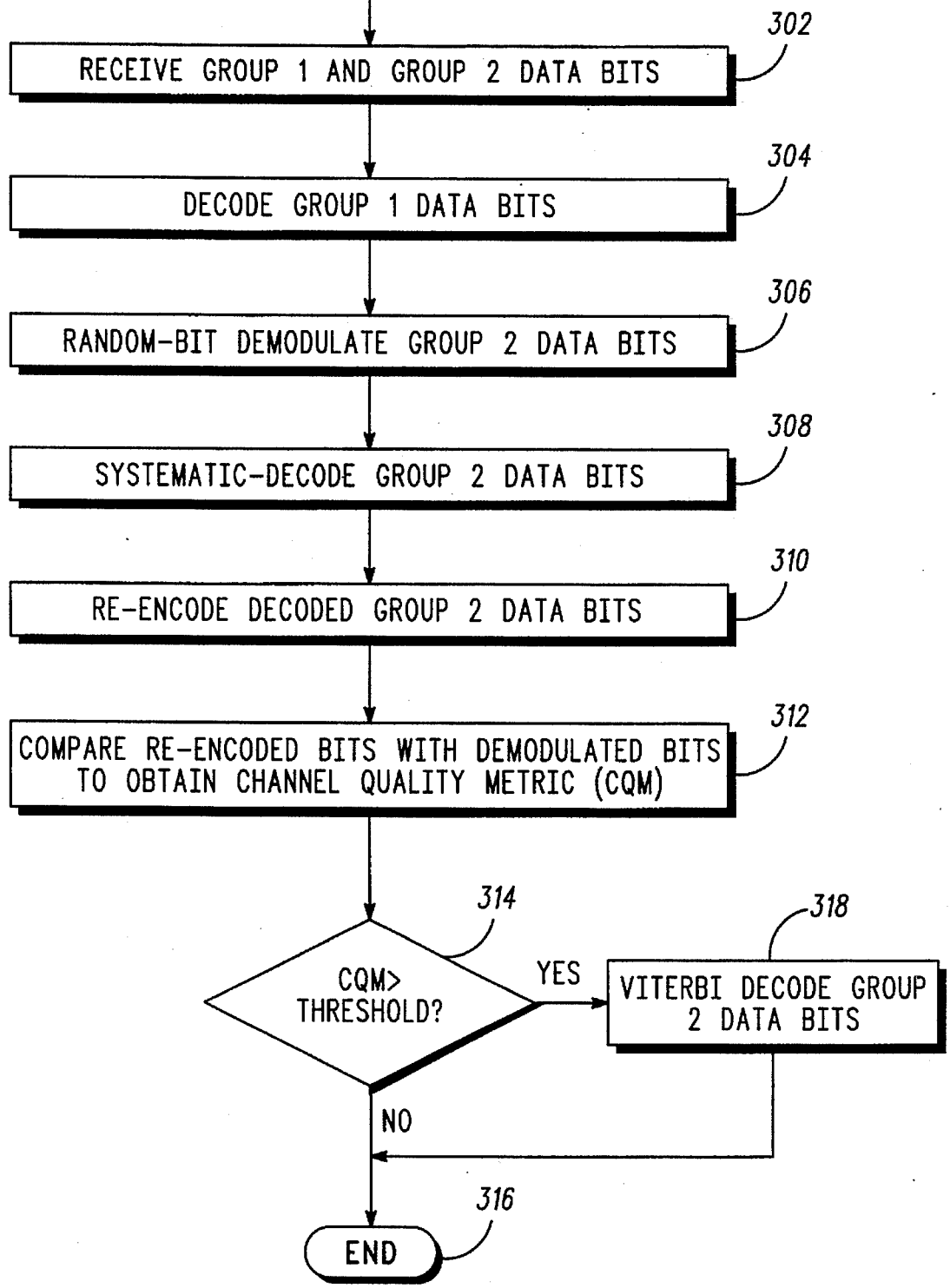

METHOD FOR DETERMINING A CHANNEL QUALITY METRIC IN A RECEIVER

FIELD OF THE INVENTION

The present invention relates generally to communication systems and, in particular, to a method of determining a channel quality metric for a channel within a communication system.

BACKGROUND OF THE INVENTION

The use of digital technology has led to great advances in the efficiency, reliability, and flexibility of voice and data communication systems. Nevertheless, it is a basic principle of communication theory that any information transmitted via a non-ideal medium, such as an RF (radio frequency) channel, is subject to degradation from a variety of sources. Digitally transmitted information is no exception.

For example, in an RF-based, digital voice communication system, an analog representation of voice information is typically sampled by a transmitter to create a continuous stream of digital information. The stream of digital information, in turn, is used to modulate an RF carrier. When the digitally modulated RF carrier is received by a receiver, the digital information is recovered. Degradation inherent to the RF carrier is reflected as errors in the recovered digital information, and thus adversely affects the analog representation reconstructed from the recovered digital information.

One advantage of digitally transmitted information, however, is that various techniques exist whereby errors occurring during the transmission of digital information (typically represented as bits or symbols) can be detected and, in some cases, corrected. Such techniques are often collectively referred to as error correction coding.

Error correction codes provide protection against errors by creating redundancy for the information being transmitted. This redundancy takes the form of additional bits appended to the information, often called parity bits. Prior to transmission over a communication channel, the information is passed through a known encoding function that generates uniquely encoded information, composed of the original information and its parity bits. The encoded information is then transmitted, via the communication channel, to a receiver. The receiver passes the received encoded information through a decoding function that uses the parity bits to determine if any errors have occurred in the information. Depending on the encoding/decoding function used, a finite number of errors can be detected and corrected. Most error correction coding schemes are unable to correct any errors when too many errors have occurred, resulting in uncorrectable errors. Examples of these types of error correction coding techniques are linear block codes (e.g., Hamming codes, BCH codes, etc.) and convolutional or trellis codes.

Unfortunately, the use of error correction coding techniques tends to increase the complexity of digital communication systems, principally at the receiver. This presents a significant problem, especially in communication systems that deal with information possessing various levels of error sensitivity. In the present context, error sensitivity describes the relationship between the occurrence of an error in a particular "piece" of digital information and the resultant effect on the desired output; errors in highly sensitive data cause dramatic and disastrous effects, while errors in insensitive data cause nearly imperceptible effects. Digital information can be divided into three classes: a relatively small set of highly error-sensitive (critical) data, a relatively large set of mildly error-sensitive (important) data, and a variable sized set of error-insensitive (non-critical) data. Examples of systems in which data may be partitioned by error sensitivity are low bit-rate compressed voice systems, and packet data transmission systems.

As mentioned above, errors occurring in critical data typically have a dramatic impact on the quality of information reconstructed from the critical data. Thus, owing to the complexity of error correction decoding, it would be advantageous to have knowledge of a channel quality metric that indicates the likelihood of uncorrectable errors in critical data before attempting further error detection/correction in less critical data. Although the linear block codes and convolutional/trellis codes discussed above can be used to produce such a channel quality metric under certain channel conditions, it is always desirable to enhance the performance and reduce the complexity of such error correction coding techniques.

Accordingly, there exists a need for a method for a receiver in a communications system to determine a channel quality metric. Such a method should offer enhanced performance and reduced complexity over prior art techniques.

BRIEF DESCRIPTION OF THE DRAWINGS

FIG. 3 illustrates a logic diagram that may be utilized by an error correction decoder to implement a preferred embodiment of the present invention.

DESCRIPTION OF A PREFERRED EMBODIMENT

Generally, the present invention provides a method for a receiver in a communications system to determine a channel quality metric. This is accomplished by processing two streams of discrete data elements: a received first data stream and a received second data stream. The received second data stream is demodulated using the first data stream to produce a demodulated second data stream. The demodulated second data stream is subsequently decoded and re-encoded, resulting in a re-encoded stream of data elements. A channel quality metric is determined by comparing the re-encoded stream of data elements to the demodulated second stream of data elements. This method offers enhanced performance and reduced complexity in determining a channel quality metric.

Figure 1:
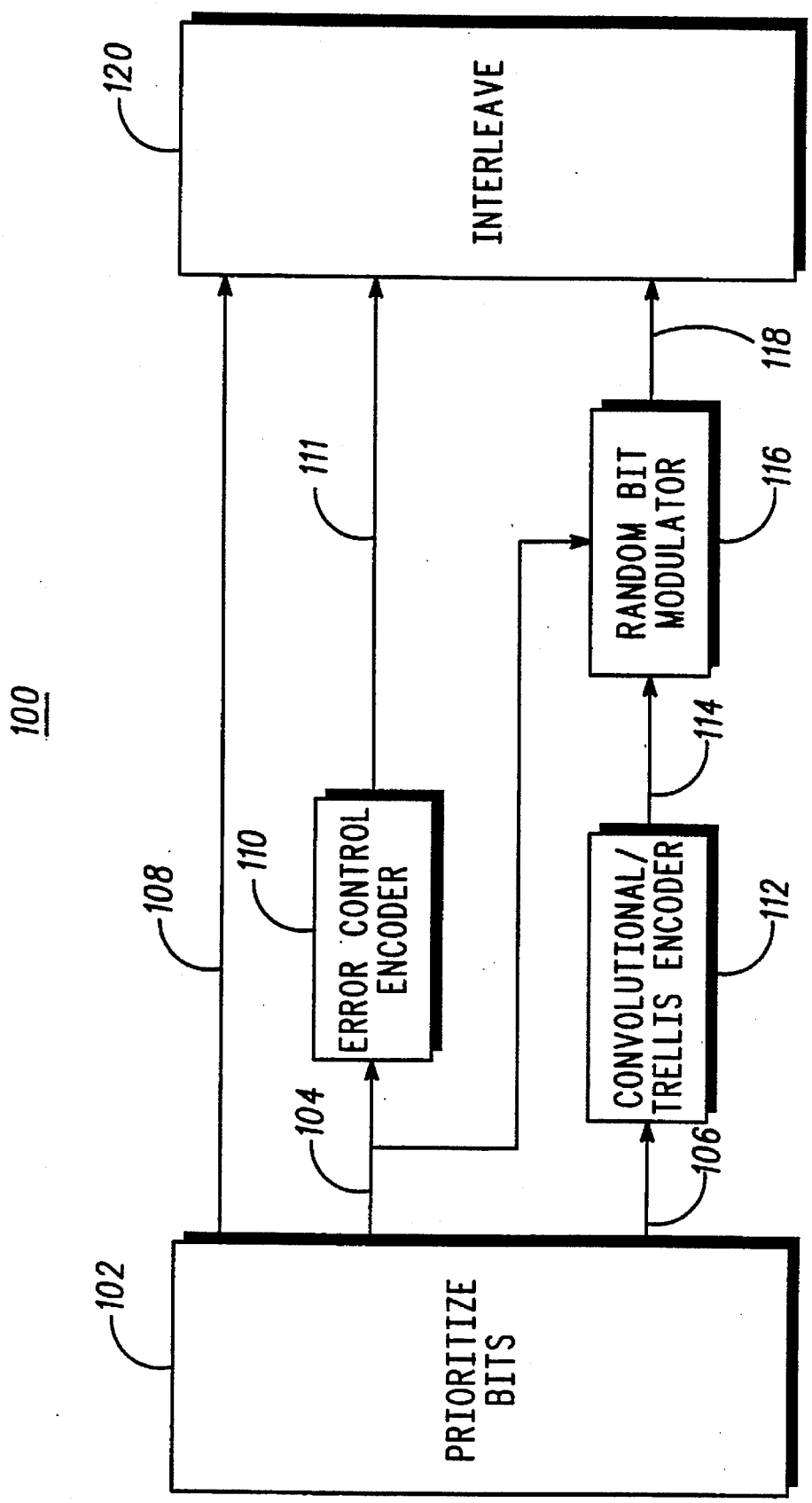
FIG. 1 illustrates a block diagram of an error correction encoder, in accordance with a preferred embodiment of the present invention.

The present invention can be more fully described with reference to FIGS. 1–3. FIG. 1 illustrates a block diagram of an error correction encoder (100) in accordance with the present invention. Operation of the encoder (100) begins with a bit prioritization (102) of inputted discrete data elements (not shown). In the context of the present invention, discrete data elements might be binary bits, or symbols representing two or more bits. In a preferred embodiment, the bit prioritization (102) divides the discrete data elements into three streams. A first stream of discrete data elements (104) consists of discrete data elements that are critical to a communication system's ability to convey information. A second stream of discrete data elements (106) consists of discrete data elements that are important, but not critical, to a communication system's ability to convey information. Finally, a third stream of discrete data elements (108) consists of discrete data elements that are relatively non-critical to a communication system's ability to convey information.

After bit prioritization, an error control encoder (110) encodes the first stream (104) using a first encoding technique. For instance, the error control encoder (110) may use a linear block code (e.g., a Golay or a Hamming code), a convolutional code, or a trellis coded modulation code to encode the first stream (104). An output of the error control encoder (110) is an encoded first stream of discrete data elements (111). Similarly, a second error control encoder (112), using a second encoding technique, encodes the second stream (106) to produce an encoded second stream of data elements (114). For example, the second error control encoder (112) may use a trellis coded modulation code or a convolutional code to encode the second stream (106).

Taking the encoded second stream (114) and the first stream (104) as inputs, a random bit modulator (116) is used to create a modulated second stream of discrete data elements (118). Well understood by those skilled in the art, the random bit modulator (116) modulates each encoded discrete data element of the encoded second stream (114) with a corresponding discrete data element of a random modulation sequence generated by a pseudo-random number generator (not shown). In a preferred embodiment, the first stream (104) functions as a key for the pseudo-random number generator to ensure that the discrete data elements of the random modulation sequence are accurately reproduced by a receiver. In this sense, the modulated second stream (118) is uniquely determined by the first stream (104), i.e., the critical data.

After prioritization, encoding, and modulation, an interleaver (120) is used to interleave the streams of discrete data elements (108, 111, 118). The interleaver (120) combines the third stream (108), the encoded first stream (111), and the modulated second stream (118) into a single stream and block interleaves the result. Block interleaving is a well known technique used to combat burst errors. The resulting stream of interleaved data elements (not shown) is usually transmitted via a communications channel—such as TDM (time-division multiplexed) slots, carrier frequencies, a pair of carrier frequencies or any other RF transmission media—to a receiver.

Figure 2:
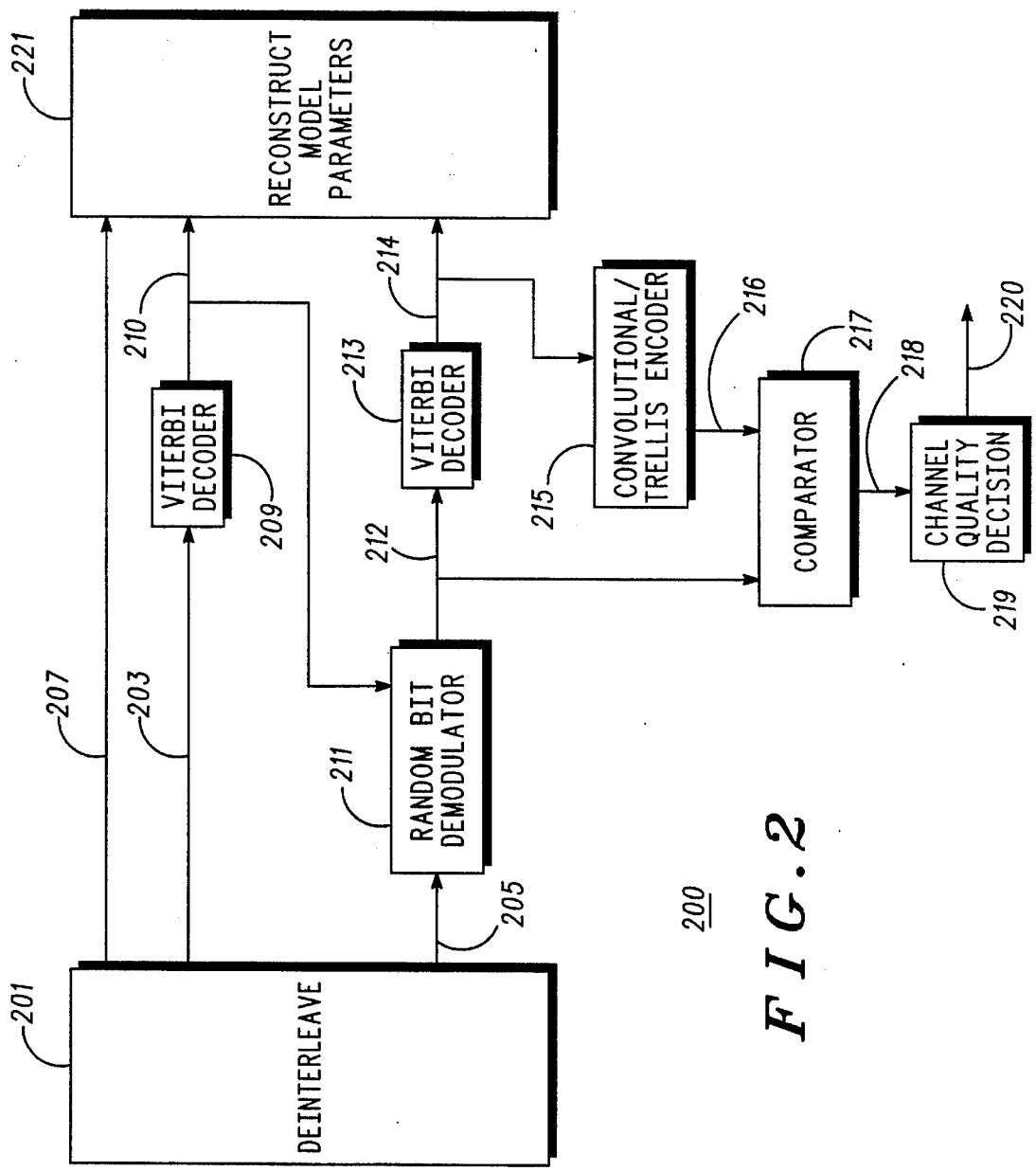
FIG. 2 illustrates a block diagram of an error correction decoder, in accordance with a preferred embodiment of the present invention.

FIG. 2 illustrates a block diagram of an error correction decoder (200) in accordance with the present invention. Operation of the decoder (200) begins with a deinterleaver (201) separating a received stream of discrete data elements (not shown) into a received first stream of discrete data elements (203), a received second stream of discrete data elements (205), and a received third stream of discrete data elements (207). The received first stream (203) corresponds to the encoded first stream (111) prior to transmission; the received second stream (205) corresponds to the modulated second stream (118); finally, the received third stream (207) corresponds to the third stream (108). An error control decoder (209) decodes the received first stream (203) to produce a decoded first stream of discrete data elements (210). In a preferred embodiment, the error control decoder (209) is a block decoder or a Viterbi decoder, depending on the first technique used by the error control encoder (110). If the condition of the communications channel was favorable, i.e., no uncorrectable errors were caused by transmission, the decoded first stream (210) is identical to the first stream (104).

The decoded first stream (210) and the received second stream (205) are input to a random bit demodulator (211) that uses the decoded first stream (210) to demodulate the received second stream (205). In particular, the decoded first stream (210) is used as a key for a pseudo-random number generator (not shown), which in turn is used to create a random modulation sequence of discrete data elements. A demodulated second stream of discrete data elements (212) is produced by demodulating each of the discrete data elements of the received second stream (205) with corresponding discrete data elements of the random modulation sequence. If the error control decoder (209) has correctly estimated (i.e., decoded) the first data stream (104)—i.e., the decoded first stream (210) is identical to the first stream (104)—the demodulated second stream (212) is identical to the encoded second stream (114). Otherwise, the demodulated second stream (212) is significantly different from the encoded second stream (114).

The demodulated second stream (212) is input to a second error control decoder (213) which, in a preferred embodiment, is a Viterbi decoder or a systematic decoder depending on the second technique used by the second error control encoder (112). The second error control decoder (213) decodes the demodulated data stream to provide an estimate (214) of the second stream (106).

In order to calculate a channel quality metric, the estimated second stream (214) is re-encoded by a third encoder (215) to produce a re-encoded stream of discrete data elements (216). In general, the third encoder (215) utilizes an identical coding technique as that used by the second error control encoder (112). The re-encoded stream (216) and the demodulated second stream (212) are routed to a comparator (217). The comparator (217) calculates the similarity of its inputs. For instance, if a non-systematic convolutional or trellis code is used by the second error control encoder (112), then the comparator (217) counts the number of occurrences of differing data elements in the re-encoded and demodulated streams (216, 212). Alternatively, if a systematic convolutional or trellis code is used by the second error control encoder (112), the comparator (217) counts the number of occurrences of differing redundant discrete data elements in the re-encoded and the estimated streams. Systematic codes, as known in the art, are those error correction codes that produce an encoded output stream by periodically adding redundant discrete data elements to the original data.

The comparator (217) produces a difference metric (218) based on the number of differing data elements in the re-encoded and demodulated streams (216, 212). In general, the number of differing elements will be low if the received second stream (205) is demodulated correctly. As previously noted, the received second stream (205) will be demodulated correctly only if the correct key is used in the pseudo-random number generator. Equivalently, the received second stream (205) will be demodulated correctly only if the error control decoder (209) correctly estimates the first data stream (104) since the first data stream (104) is the key to the pseudo-random number generator. Furthermore, the received first stream (203) will be decoded correctly if the condition of the transmission channel is good. In short, if the communications system can reliably send critical bits through the transmission channel, then the condition of the transmission channel is considered good; otherwise, the condition of the transmission channel is considered poor.

Based upon the difference metric (218) produced by the comparator (217), a channel quality decision (219) is made, resulting in the channel quality metric (220). In a preferred embodiment, the channel quality metric (220) is low (e.g., a logic 0 indicating poor channel quality) if the difference metric (218) is high. Conversely, the channel quality metric (220) is high (e.g., a logic 1 indicating good channel quality) if the difference metric (218) is low. In this sense, a high channel quality metric is construed to be favorable. In general, the condition of the transmission channel is considered poor if the number of differing data elements approaches fifty-percent of the number of elements in the demodulated second stream (212). On the other hand, if the number of differing data elements approaches zero, the condition of the transmission channel is considered good.

In a preferred embodiment, the channel quality decision (219) is made through the use of a threshold function. If the difference metric (218) exceeds the threshold, then the channel quality metric (220) is set low. Otherwise, the channel quality metric (220) is set high. Generally, the threshold function is determined by empirical data collected from training experiments. In particular, the threshold is selected to maximize the likelihood that the channel quality metric (220) is set low when the error control decoder (209) incorrectly estimates the first stream (104), i.e., uncorrectable errors detected. In a similar vein, the threshold is also selected to minimize the likelihood that the channel quality metric (220) is set low even though the error control decoder (209) correctly estimates the first stream (104), i.e., a false alarm.

Based on the channel quality metric (220), the original input discrete data elements can be reconstructed (221) from the decoded first stream (210), the estimated second stream (214), and the third stream (207). If the channel quality metric (220) is unfavorable (i.e., a logic 0), there is no need to reconstruct the original input discrete data elements since there is a high probability that the data is corrupted to the point that it is unusable. For example, in a low bit-rate compressed voice system, if the channel quality metric is unfavorable, there is no need to decompress the voice information since parameters critical to the intelligibility of the reproduced voice are most likely useless. Rather than using bad data, other processing can be done to mitigate the effects of the uncorrectable errors. In this manner, a receiver incorporating the present invention may operate more efficiently.

FIG. 3 illustrates a flow diagram of an economic decode process (300) that a receiver may incorporate to implement the present invention. Operation of the receiver begins at step 302 where Group 1 and Group 2 data bits are received. For the purposes of this discussion, Group 1 and Group 2 data bits are analogous to the received first stream (203) and the received second stream (205) of FIG. 2. Continuing, the receiver decodes the Group 1 data bits (304) and random-bit demodulates the Group 2 data bits (306) using the decoded Group 1 data, as described with reference to FIG. 2 above. Assuming a systematic encoder is used to generate the Group 2 data, the resulting demodulated Group 2 data includes redundant data elements.

Next, a systematic decoder is used to produce decoded Group 2 data (308). As described earlier, a systematic encoder produces an encoded output stream by adding redundant data elements to the original data. Conversely, a systematic decoder operates by extracting the original data elements from the encoded output stream. Likewise, a systematic decoder can also extract the redundant data elements from the encoded output stream. Because extracting data from a stream requires very few computations, the complexity of the systematic decoder is very low. However, since a systematic decoder does not use the redundant data elements to produce an estimate of the original data, the reliability of the decoder is also low. Consequently, data decoded in such a manner is used only for the purpose of determining a channel quality metric, and not for the purposes of parameter reconstruction.

After the systematic decoding of step 308, the decoded Group 2 data is re-encoded (310) using the same systematic technique that produced the Group 2 data. At a minimum, the re-encoding of step 310 must generate an estimate of the redundant data elements. The re-encoded Group 2 data is compared (312) with the demodulated Group 2 data to generate a channel quality metric, as previously described with reference to FIG. 2. In a preferred embodiment, the estimate of the redundant data elements is compared with the corresponding redundant data elements contained in the demodulated Group 2 data.

If the resulting channel quality metric is good (314)—in the sense that the channel quality metric exceeds a fixed threshold—a more complex and reliable decoding approach (e.g., one that incorporates the redundant data elements) is used to produce an estimate of the Group 2 data (318). In a preferred embodiment, a Viterbi decoder is used to produce an estimate of the Group 2 data when the channel quality metric is favorable.

If the resulting channel quality metric is poor (314), the present invention saves valuable computation resources by not executing the more complex decoding approach. This enables the present invention to save these resources for other important processing, such as error concealment techniques.

The present invention provides a method for determining a channel quality metric in a communications system. In particular, the present invention determines a channel quality metric by counting the number of differing data elements in a demodulated stream of discrete data elements and a re-encoded stream of discrete data elements. In general, the value of the channel quality metric will be high if an independent stream of critical data elements is decoded correctly, otherwise, the value of the channel quality metric will be low. In this manner, the present invention can be advantageously employed in a wide variety of situations requiring a reliable method for detecting decoding errors in a stream of critical data elements.

I claim:

1. In a receiver, a method of determining a channel quality metric using a first stream of discrete data elements and at least a second stream of discrete data elements that have been modulated using the first stream of discrete data elements, the method comprising the steps of:

A) receiving the first stream of discrete data elements to produce a received first data stream;

B) receiving the second stream of discrete data elements to produce a received second data stream;

C) decoding the received first data stream to produce a decoded first stream of discrete data elements:

D) demodulating the received second data stream using the decoded first stream of discrete data elements to produce a demodulated second data stream;

E) decoding the demodulated second data stream to produce an estimate of the second stream of discrete data elements;

F) encoding the estimate of the second stream of discrete data elements to produce a re-encoded stream of data elements; and G) comparing the re-encoded stream of data elements and the demodulated second data stream to produce the channel quality metric.

2. The method of claim 1 wherein step C) comprises the step of demodulating the received second data stream by combining the received second data stream with a random modulation sequence of discrete data elements, wherein the random modulation sequence is based on the received first data stream.

3. The method of claim 1 wherein step D) comprises the step of decoding the demodulated second data stream using a Viterbi decoder.

4. The method of claim 1 wherein step E) comprises the step of encoding the estimate of the second stream of discrete data elements using a convolutional encoder.

5. The method of claim 1 wherein step E) comprises the step of encoding the estimate of the second stream of discrete data elements using a trellis encoder.

6. The method of claim 1 wherein step F) comprises the step of counting a number of occurrences of differing data elements between the re-encoded stream of data elements and the demodulated second data stream.

7. In a receiver, a method of determining a channel quality metric using a first stream of discrete data elements and at least a second stream of discrete data elements that have been modulated using the first stream of discrete data elements, the method comprising the steps of:

A) receiving the first stream of discrete data elements to produce a received first data stream;

B) receiving the second stream of discrete data elements that include redundant data elements, to produce a received second data stream;

C) decoding the received first data stream to produce a decoded first stream of discrete data elements:

D) demodulating the received second data stream using the decoded first stream of discrete data elements to produce a demodulated second data stream;

E) producing an estimate of the second stream of discrete data elements using a first technique;

F) encoding the estimate of the second stream of discrete data elements to produce an estimate of the redundant data elements; and G) comparing the redundant data elements and the estimate of the redundant data elements, to produce the channel quality metric.

8. The method of claim 7, further comprising the step of:

G) decoding, responsive to the step of comparing, the demodulated second data stream using a second technique to produce a usable stream of discrete data elements.

9. The method of claim 8 wherein step G) comprises the step of Viterbi decoding the demodulated second data stream when the channel quality metric is favorable.

10. In a communication system including a transmitter, a receiver, and a channel for communications between the transmitter and the receiver, a method of determining a channel quality metric using a first stream of discrete data elements and at least a second stream of discrete data elements, the method comprising the steps of:

at the transmitter;

A) encoding the first stream of discrete data elements using a first technique to produce an encoded first stream of discrete data elements;

B) encoding the second stream of discrete data elements using a second technique to produce an encoded second stream of discrete data elements;

C) modulating the encoded second stream of discrete data elements using the first stream of discrete data elements to produce a modulated second stream of discrete data elements; and D) transmitting, via the channel, the encoded first stream of discrete data elements and the modulated second stream of discrete data elements;

at the receiver;

E) receiving the encoded first stream of discrete data elements to produce a received first stream of discrete data elements;

F) decoding the received first stream of discrete data elements to produce a decoded first stream of discrete data elements;

G) receiving the modulated second stream of discrete data elements to produce a received second stream of discrete data elements;

H) demodulating the received second stream of discrete data elements using the decoded first stream of discrete data elements to produce a demodulated second stream of discrete data elements;

I) decoding the demodulated second stream of discrete data elements to produce an estimate of the second stream of discrete data elements;

J) encoding the estimate of the second stream of discrete data elements to produce a re-encoded stream of discrete data elements; and K) comparing the re-encoded stream of discrete data elements and the demodulated second stream of discrete data elements to produce the channel quality metric.

11. The method of claim 10 wherein step B) comprises the step of encoding the second stream of discrete data elements using a convolutional encoder.

12. The method of claim 10 wherein step B) comprises the step of encoding the second stream of discrete data elements using a trellis encoder.

13. The method of claim 10 wherein step C) comprises combining the encoded second stream of discrete data elements with a random modulation sequence of discrete data elements, wherein the random modulation sequence of discrete data elements is based on the first stream of discrete data elements.

* * * * *